(12) United States Patent
Berner et al.

(10) Patent No.: US 11,431,937 B2
(45) Date of Patent: *Aug. 30, 2022

(54) DATA RATE CONTROL FOR EVENT-BASED VISION SENSOR

(71) Applicant: Sony Advanced Visual Sensing AG, Schlieren (CH)

(72) Inventors: Raphaël Berner, Confignon (CH); Christian Brändli, Baden (CH); Massimo Zannoni, Zürich (CH)

(73) Assignee: Sony Advanced Visual Sensing AG, Zürich (CH)

( * ) Notice: Subject to any disclaimer, the term of this patent is extended or adjusted under 35 U.S.C. 154(b) by 80 days.

This patent is subject to a terminal disclaimer.

(21) Appl. No.: 16/884,129

(22) Filed: May 27, 2020

(65) Prior Publication Data

US 2020/0288073 A1    Sep. 10, 2020

Related U.S. Application Data

(63) Continuation of application No. 15/858,840, filed on Dec. 29, 2017, now Pat. No. 10,715,750.

(30) Foreign Application Priority Data

Dec. 30, 2016  (CH) .............................. 20160001764
Dec. 30, 2016  (CH) .............................. 20160001765

(51) Int. Cl.
*H04N 5/30*    (2006.01)
*H04N 5/378*   (2011.01)
(Continued)

(52) U.S. Cl.
CPC ................ *H04N 5/378* (2013.01); *G01J 1/46* (2013.01); *G06F 11/004* (2013.01); *G06T 7/20* (2013.01);
(Continued)

(58) Field of Classification Search
CPC .... H04N 5/3741; H04N 5/3745; H04N 5/341; H04N 5/35518; H04N 5/378;
(Continued)

(56) References Cited

U.S. PATENT DOCUMENTS 5,107,103 A    4/1992  Gruss et al.
5,488,415 A    1/1996  Uno
(Continued)

FOREIGN PATENT DOCUMENTS

DE    101 25 307    8/2002
DE    103 01 598    3/2004
(Continued)

OTHER PUBLICATIONS

Brandli, C., et al., "A 240 x 180 130 dB 3 us Latency Global Shutter Spatiotemporal Vision Sensor," IEEE J. Solid-State Circuits, 49(10): 2333-2341 (2014).
(Continued)

*Primary Examiner* — Qian Yang
(74) *Attorney, Agent, or Firm* — HoustonHogle LLP

(57) ABSTRACT

In dynamic vision sensor (DVS) or change detection sensors, the chip or sensor is configured to control or modulate the event rate. For example, this control can be used to keep the event rate close to a desired rate or within desired bounds. Adapting the configuration of the sensor to the scene by changing the ON-event and/or the OFF-event thresholds, allows having necessary amount of data, but not much more than necessary, such that the overall system gets as much information about its state as possible.

17 Claims, 9 Drawing Sheets

(51) Int. Cl.

| | |
|---|---|
| *H04N 5/3745* | (2011.01) |
| *H04N 5/374* | (2011.01) |
| *H04N 5/335* | (2011.01) |
| *H04N 5/341* | (2011.01) |
| *G01J 1/46* | (2006.01) |
| *G06F 11/00* | (2006.01) |
| *G06T 7/20* | (2017.01) |
| *H04N 5/355* | (2011.01) |

(52) U.S. Cl.
CPC .......... *H04N 5/3355* (2013.01); *H04N 5/341* (2013.01); *H04N 5/35518* (2013.01); *H04N 5/3741* (2013.01); *H04N 5/3745* (2013.01); *H04N 5/37455* (2013.01); *G06F 2201/86* (2013.01); *G06F 2201/88* (2013.01)

(58) Field of Classification Search
CPC ............ H04N 5/37457; H04N 5/3355; H04N 5/37455; H04N 5/345; H01L 27/1461; G06T 7/20; G01J 1/46; G06F 11/004; G06F 2201/86; G06F 2201/88
See application file for complete search history.

(56) References Cited

U.S. PATENT DOCUMENTS

| | | | |
|---|---|---|---|
| 6,253,161 | B1 | 6/2001 | Arias-Estrada |
| 6,624,849 | B1 | 9/2003 | Nomura |
| 7,728,269 | B2 | 6/2010 | Lichtsteiner et al. |
| 9,143,680 | B2 | 9/2015 | Lee et al. |
| 9,544,507 | B2 | 1/2017 | Serrano Gotarredona et al. |
| 9,631,974 | B2 | 4/2017 | Delbruck et al. |
| 9,693,001 | B2 | 6/2017 | Kim et al. |
| 9,739,660 | B2 | 8/2017 | Suh et al. |
| 10,602,083 | B2 | 3/2020 | Berner et al. |
| 2008/0135731 | A1 | 6/2008 | Lichtsteiner et al. |
| 2009/0268070 | A1 | 10/2009 | Hosier |
| 2010/0270459 | A1 | 10/2010 | Augusto |
| 2013/0250151 | A1 | 9/2013 | Kato |
| 2014/0326854 | A1 | 11/2014 | Delbruck et al. |
| 2014/0374572 | A1 | 12/2014 | Kim et al. |
| 2015/0069218 | A1 | 3/2015 | Cho et al. |
| 2015/0194454 | A1 | 7/2015 | Kim et al. |
| 2015/0350581 | A1 | 12/2015 | Bosset et al. |
| 2016/0078001 | A1 | 3/2016 | Wang et al. |
| 2016/0227135 | A1 | 8/2016 | Matolin et al. |
| 2017/0140509 | A1 | 5/2017 | Lee et al. |

FOREIGN PATENT DOCUMENTS

| | | |
|---|---|---|
| EP | 0 553 406 | 4/1997 |
| EP | 1 657 910 | 5/2006 |
| EP | 2 538 665 | 12/2012 |
| JP | 2007-166581 A | 6/2007 |
| WO | WO 2007085942 | 8/2007 |
| WO | WO 2013092666 | 6/2013 |
| WO | WO 2015036592 | 3/2015 |
| WO | WO 2017149433 | 9/2017 |
| WO | WO 2017158483 | 9/2017 |
| WO | WO 2017174579 | 10/2017 |

OTHER PUBLICATIONS

Chi, Y.M., et al., "CMOS Camera with In-Pixel Temporal Change Detection and ADC," IEEE J. Solid-State Circuits, 42(10): 2187-2196 (2007).

Habibi, M., "A Low Power Smart CMOS Image Sensor for Surveillance Applications," Machine Vision and Image Processing (MVIP), 1-4 (2010).

International Search Report and Written Opinion of the International Searching Authority, dated Mar. 19, 2018, from International Application No. PCT/IB2017/058526, filed on Dec. 29, 2017. 17 pages.

Lichtsteiner, P., et al., "A 128 x 128 120 dB 15 μs Latency Asynchronous Temporal Contrast Vision Sensor," IEEE J. Solid-State Circuits, 43(2): 566-576 (2008).

Aizawa, K., et al., "On Sensor Image Compression," IEEE Trans. Circ. Sys. Video Tech., 7(3): 543-548 (1997).

Aizawa, K., et al., "Computational Image Sensor for on Sensor Compression," IEEE Trans. Elec. Dev., 44(10): 1724-1730 (1997).

Delbruck, T., et al., "32-Bit Configurable Bias Current Generator with Sub-Off-Current Capability," Circuits and Systems (ISCAS), 1647-1650 (2010).

Kramer, J., "An On/Off Transient Imager with Event-Driven, Asyncronous Read-Out," IEEE, 165-168 (2002).

International Search Report and Written Opinion of the International Searching Authority, dated Mar. 19, 2018, from International Application No. PCT/IB2017/058528, filed on Dec. 29, 2017. 11 pages.

Ruedi, P.-F., et al., "A 128 X 128 Pixel 120-dB Dynamtic-Range Vision-Sensor Chip for Image Contrast and Orientation Extraction," IEEE J. Solid-State Circ., 38(12): 2325-2333 (2003).

International Search Report of the International Searching Authority, dated May 9, 2017, from International Application No. PCT/IB2017/051129, filed on Feb. 27, 2017. 5 pages.

Written Opinion of the International Searching Authority, dated May 9, 2017, from International Application No. PCT/IB2017/051129, filed on Feb. 27, 2017. 10 pages.

International Search Report of the International Searching Authority, dated May 29, 2017, from International Application No. PCT/IB2017/051421, filed on Mar. 10, 2017. 4 pages.

Written Opinion of the International Searching Authority, dated May 29, 2017, from International Application No. PCT/IB2017/051421, filed on Mar. 10, 2017. 9 pages.

Fu, Z., et al., "A 1.2mWCMOS Temporal-Difference Image Sensor for Sensor Networks," IEEE, 1064-1067 (2008).

International Preliminary Report on Patentability, dated Jul. 11, 2019, from International Application No. PCT/IB2017/058528, filed on Dec. 29, 2017. 8 pages.

DATA RATE CONTROL FOR EVENT-BASED VISION SENSOR

RELATED APPLICATIONS

This application is a Continuation of U.S. patent application Ser. No. 15/858,840, filed on Dec. 29, 2017, which claims priority to Swiss Provisional Patent Application No. CH20160001764, filed on 30 Dec. 2016, and Swiss Provisional Patent Application No. CH20160001765, filed on 30 Dec. 2016, all of which are incorporated herein by reference in their entirety.

BACKGROUND OF THE INVENTION

Today, machine vision is mostly based on conventional cameras and their associated frame-based image sensors. For some machine vision tasks, e.g., object recognition, these conventional frame-based cameras are well suited. However, for other tasks, e.g., tracking or position and motion estimation, the conventional image sensors have drawbacks.

The main drawback is that conventional cameras produce a significant amount of redundant and unnecessary data, which has to be captured, communicated and processed. This high data load slows down the reaction time by decreasing temporal resolution, results in increased power consumption, and increases the size and cost of machine vision systems. In addition, most image sensors suffer from limited dynamic range, poor low-light performance and motion blur.

These drawbacks arise from the fact that the data is captured as a sequence of still images (frames). In some cases, encoding dynamic scenes as still images is useful to produce beautiful images and movies but not optimal for data processing, but this is less important for many machine-vision uses.

Conventional computer vision systems using conventional cameras typically compare features between sequential image frames for object recognition. To estimate the position and orientation of a mobile system and to infer a three dimensional map of the surrounding world, two sequential images, which are partially overlapping but taken at different times and from different poses, are compared. To infer the motion that occurred between the two frames, characteristic visual landmarks (key points or other visual features) have to be matched across the two images. Finding these pairs of points that correspond to each other in both images is known as solving the "correspondence problem."

Solving the correspondence problem requires significant amount of processing power. To detect landmarks, every pixel in an image may have to be searched for characteristic features (corners, blobs, edges, etc.). The pixels and their surrounding neighborhood of pixels are then grouped to characterize the so called feature descriptors, which are then used for matching the features between the frames and thereby establishing pairs of corresponding points. This is computationally intensive. Direct approaches that directly compare pixel intensities are computationally even more complex.

On the other hand, the so-called Dynamic Vision Sensor (DVS) or event based change detection sensor is a sensor that overcomes the limitations of frame-based encoding. By using in-pixel data compression, the data redundancy is removed and high temporal resolution, low latency, low power consumption, high dynamic range with little motion blur is achieved. DVS is thus well suited especially for solar or battery powered compressive sensing or for mobile machine vision applications where the position of the system has to be estimated and where processing power is limited due to limited battery capacity.

The DVS pre-processes visual information locally. Instead of generating crisp images, the DVS produces smart data for computer applications. While conventional image sensors capture a movie as a series of still images, the DVS detects and only transmits the position of changes in a scene. It thus encodes the visual information much more efficiently than conventional cameras because it encodes in-pixel data compression. Specifically, rather than encoding frames as image data, the DVS detects changes and encodes those changes as change events. This means that the processing of the data is possible using less resources, lower net power and with faster system reaction time. The high temporal resolution allows continuously tracking visual features and thereby overcoming the correspondence problem. Additionally, the architecture of DVS allows for high dynamic range and good low-light performance.

SUMMARY OF THE INVENTION

A general property of DVS or change detection sensors is that the output data rate is variable, because the event rate depends on the scene that the sensor is observing, as well as on the sensor configuration.

The variable amount of change events to be read out from the sensor can pose problems on the sensor and at the system level, especially if there are more events to be read out than what the processor can process in real-time.

Discarding the events if they cannot be processed leads to data loss and thus the system loses information about its status (e.g. about its movement and position). In the case of a change detection sensor, the result could be that the sensor will miss events occurring in a portion of its pixel field, for example.

Adapting the configuration of the sensor to the scene allows having as much data as necessary but not much more, such that the overall system gets as much information about its state as possible. On the other hand, the number of events can be controlled based on the state of the sensor. For example, to reduce power, it might be desirable to reduce the number of events such as during a sleep cycle and then increase the number of events during normal operating mode.

The system proposed here changes the chip or sensor configuration to control or modulate the event rate. For example, this control can be used to keep the event rate close to a desired rate or within desired bounds.

Nevertheless, the amount of events generated during a given time slice can only be determined definitively after outputting and counting them. Here, some embodiments use an event count estimator that allows a rough estimate of the number of events pending before reading them out.

With even a rough estimate of the number of events pending, the system can decide if it is able to cope with the data and read them out, or if there are too many (or too few) events, the system can redo the change detection with higher thresholds and so get fewer events (or redo the comparison with lower thresholds and get more events).

In general, according to one aspect, the invention features a change detection sensor. The sensor comprises a pixel array comprising pixels that detect light and event detectors for detecting events associated with light received by the pixels. According to the invention, an event rate detector is provided for assessing the events. A controller then changes how the pixels detect the events based on the event rate detector.

In one embodiment, the event rate detector comprises a counter for assessing the events by counting the events from the event detectors.

In another embodiment, the event rate detector comprises an event estimator for assessing the events by estimating events. This can be implemented by analyzing an analog signal that is based on the number of event detectors registering events.

Preferably, the sensor includes a threshold generation circuit for setting thresholds applied by the event detectors. The controller then changes the thresholds provided in response to the assessment provided by the event rate detector.

Preferably, the controller sets thresholds for ON events and OFF events separately based on ON events and OFF events in the pixel array.

In a current embodiment, each of the pixels comprises a memory capacitor of one of the event detectors for storing a charge corresponding to received light when the pixel was reset. Each of the pixels may further comprise one or more comparators of the event detectors for comparing the changes in received light to one or more thresholds to detect the events.

In other embodiments, the comparators are located in a readout circuit.

In general, according to another aspect, the invention features a method of operation of a change detection sensor. The method comprises detecting events associated with light received by pixels in a pixel array, assessing the events from the pixel array, and changing how the pixels detect the events based on the assessment of the events from the pixel array.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1A:
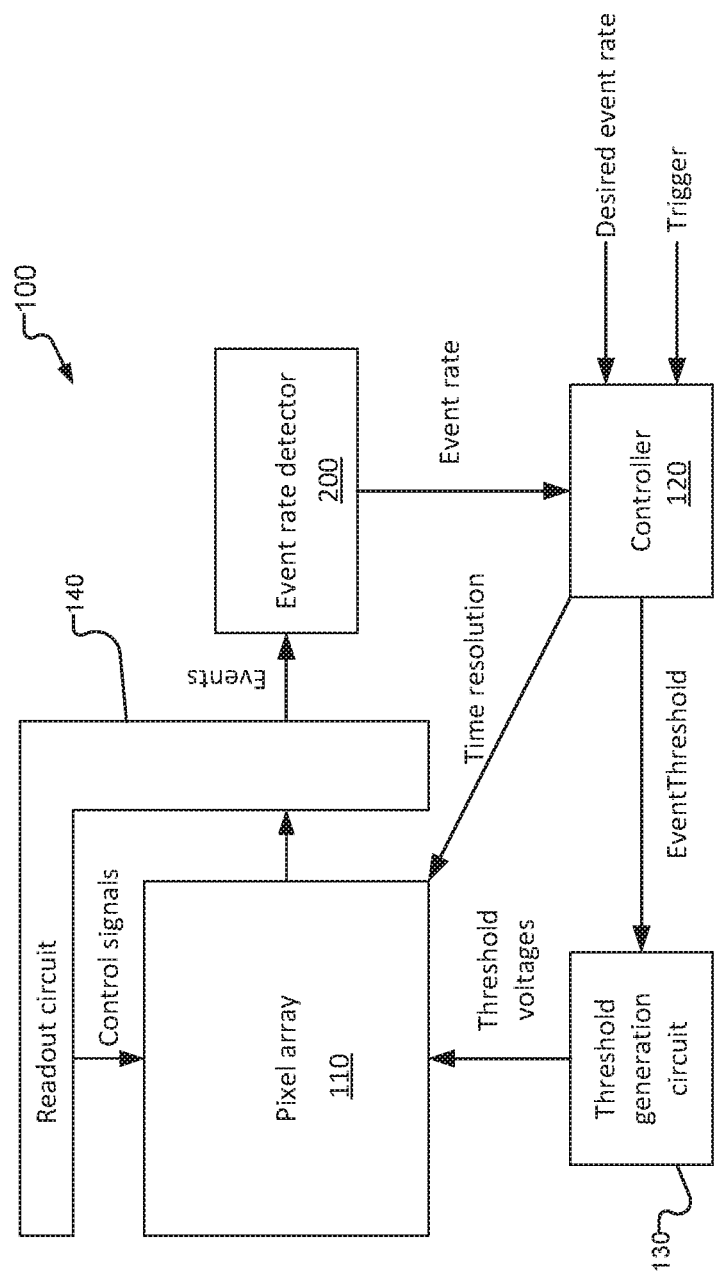
FIG. 1A is a block diagram of an event based change detection sensor including a event rate control.

FIG. 1A is a block diagram of an event based change detection sensor 100 having event rate control.

In general, the change detection sensor 100 include five elements that are specifically relevant to the present system:
array of change detection pixels 110;
an event rate detector 200;
a controller 120;
a threshold generation circuit 130; and
a readout circuit 140.

The pixel array 110 generates a variable amount of data: change events. The event rate detector 200 periodically assesses the events such as by counting or estimating the change events. Then the controller 120 adapts the sensor configuration so that in the next time step the pixel array 110 generates an amount of change events closer to the desired rate.

The pixel array can be any array of change detection pixels such as described in U.S. Pat. Appl. No. US 2008/00135731, by Lichtsteiner, et al., entitled "Photoarray for Detecting Time-Dependent Image Data", which is incorporated herein by this reference; or such as described in U.S. patent application Ser. No. 15/858,427, entitled Dynamic Vision Sensor Architecture, filed on Dec. 29, 2017, (hereinafter the Berner Patent Document, which document is incorporated herein by this reference in its entirety); or such as those disclosed in J. Kramer, "An on/off transient imager with event-driven, asynchronous read-out," IEEE International Symposium on Circuits and Systems, 2002, vol. 2, pp. 165-168, 2002) or alternatively spatial contrast detection pixels such as in Ruedit et al., "A 128×128 pixel 120-dB dynamic-range vision-sensor chip for image contrast and orientation extraction," IEEE Journal of Solid-State Circuits, vol 38, no 12, pp 2325-2333, December 2003.

Figure 1B:
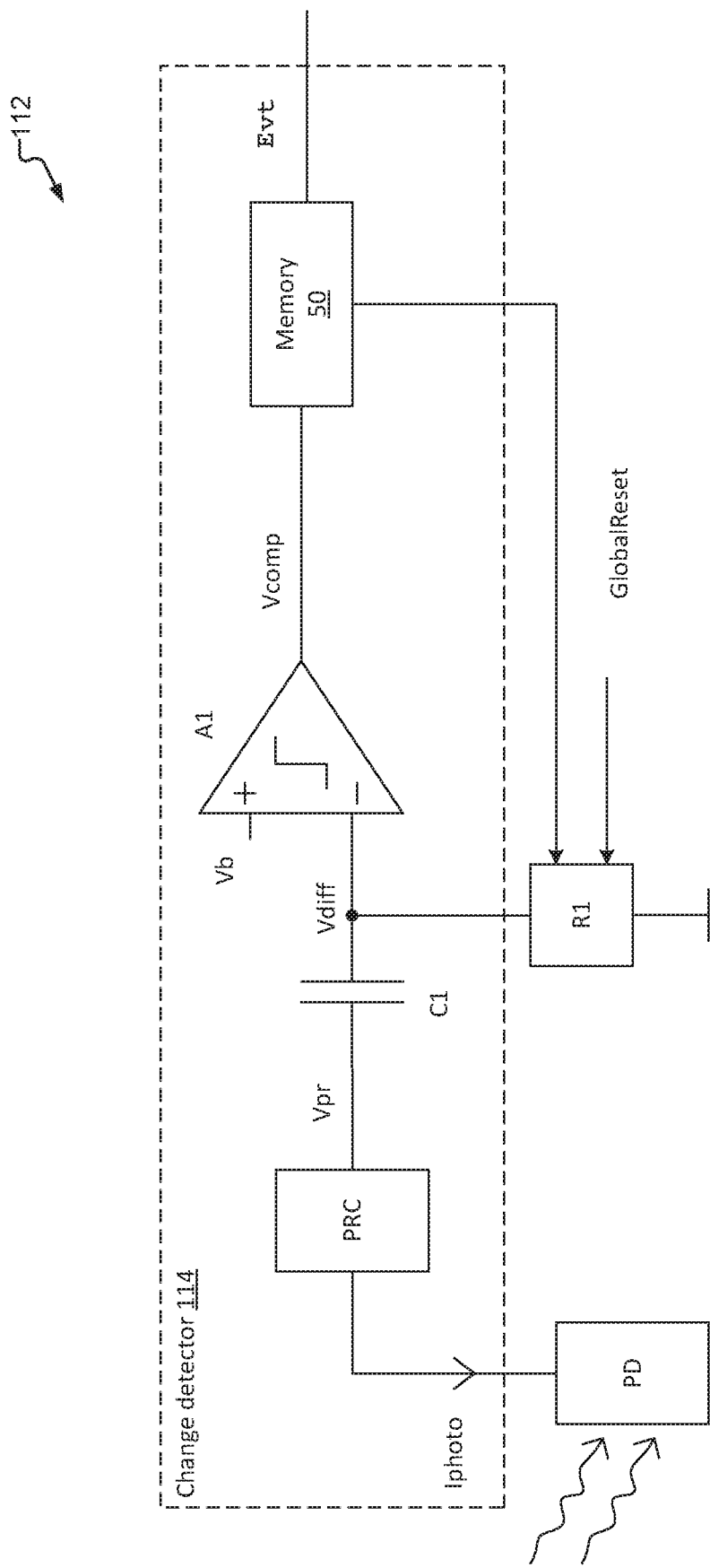
FIG. 1B is a circuit diagram showing one example of a change detection pixel that could be used in the pixel array 110.

FIG. 1B is a circuit diagram of one possible change detection pixel 112.

This exemplary pixel 112 of the two dimensional array 110 includes a photosensor such as a photodiode PD that detects or measures impinging light and converts the light intensity into a signal. Here the signal is a current, Iphoto. The pixel 112 also has an event detector 114 that then determines whether there has been a sufficient change in the light detected by the photosensor such that an event has occurred. There is this accomplished by monitoring the current Iphoto.

In more detail, the exemplary event detector 114 includes a photoreceptor circuit PRC that then generates a photoreceptor signal Vpr dependent on the light intensity. A memory capacitor C1 then remembers past photoreceptor signals.

The comparator A1 compares the difference between current photoreceptor signal Vpr and past photoreceptor signal to a threshold Vb. This threshold Vb is supplied by the threshold generation circuit 130.

Preferably, the comparator A1, or a pair of comparators, detect ON events, based on an ON event threshold, and OFF events based on an OFF event threshold. ON events are characteristic of an increase in the light received by the photosensor, and OFF events are characteristic of a decrease in the light received by the photosensor. If a single comparator is used, then the ON event threshold and the OFF event threshold are provided serially in time as threshold Vb.

This comparator A1 can be in each pixel, or shared between a subset (for example a column) of pixels. In one case, the comparators are shared and located in the readout circuit 140. Different examples of such a configuration are disclosed in the Berner Patent Document.

In the preferred embodiment, however, the comparator A1 will be integral to the pixel 112, with each pixel having one or more dedicated comparators A1.

Memory 50 stores the event or events. The events are taken from the comparator output Vcomp, based on a sample signal from the controller 120. Memory can be a sampling circuit (for example a switch and a parasitic or explicit capacitor) or a digital memory circuit (a latch or a flip-flop). In one embodiment the memory will be a sampling circuit and each pixel will have two memories, one for storing any ON event, and one for storing any OFF event. The memory supplies the output on one or more lines Evt.

A conditional reset circuit R1 provides a conditional reset based on a combination of the state of the memorized comparator output and a reset signal GlobalReset applied by the controller 120.

The pixel circuit 112 and controller 120 operate as follows.

A change in light intensity received by the photosensor PD will translate to a change in photoreceptor signal Vpr. When the reset circuit R1 is not conducting, the changes in Vpr will be reflected also in the voltage Vdiff at the inverting input (−) to the comparator A1. This occurs because the voltage across the memory capacitor C1 stays constant.

At times selected by the controller 120, the comparator A1 of the event detector 114 compares the voltage at the second terminal of the memory capacitor C1 (Vdiff) to a threshold voltage Vb (from the threshold generation circuit 130) applied to the non-inverting input (+) of the comparator A1.

The controller 120 operates the memory 50 to store the comparator output Vcomp. The memory 50 is typically implemented as part of the pixel circuit 112 as shown.

In other embodiments, however, the memory 50 is implemented as part of readout circuit 140 (peripheral circuit, one per each column of the pixel array 110).

In the illustrated embodiment, the sensor's readout circuit 140 reads out the memories 50 for each of the pixels 112 in the array 110. In one example, the readout circuit 140 stores the coordinates of the pixels in the array that have detected change events.

If the state of the stored comparator output held in the memory 50 indicates sufficient change in light intensity (i.e., an event) AND the global reset signal GlobalReset signal from the controller 120 is active, the conditional reset circuit R1 is conducting. Here "AND" indicates the logical AND operator. With the conditional reset circuit R1 in a conductive state, the voltage at the inverting input of the comparator A1 (Vdiff) is reset to a known level. Thus, it stores the current photoreceptor signal Vpr on the memory capacitor C1.

Event Counting

Figure 2:
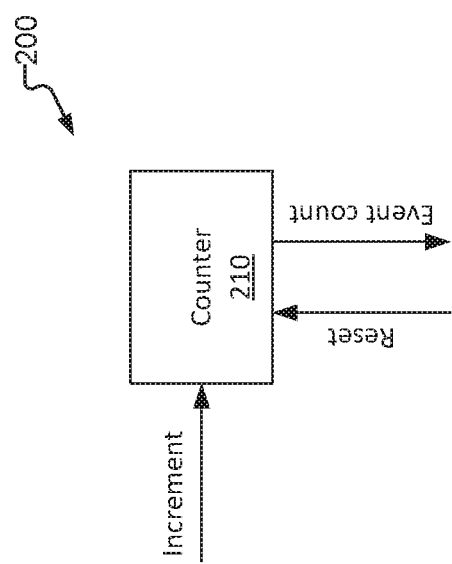
FIG. 2 is a block diagram showing one embodiment of the event rate detector 200 implemented as an event counter that is reset periodically.

FIG. 2 shows one embodiment of the event rate detector 200.

Here, the event rate detector 200 is implemented as a counter 210 that is periodically reset by the controller 120. This counter is incremented based on the events read out by the readout circuit 140. The event count is provided to the controller 120. The counter 210 is in turn reset by the controller 120 when a new count is required.

In one example, the event rate detector 200 counts the number of events output by the sensor array 110 during a given time window. Here, this is accomplished such that the readout circuit sends an Increment signal to the counter 210 every time it reads out an event from the pixel array 110.

In one specific example, the event rate detector 200 counts the number of both ON events output by the sensor array 110 and OFF events output by the sensor array 110, during a given time window. This is preferably accomplished using a separate ON event counter and OFF event counter within counter 210.

Figure 3B:
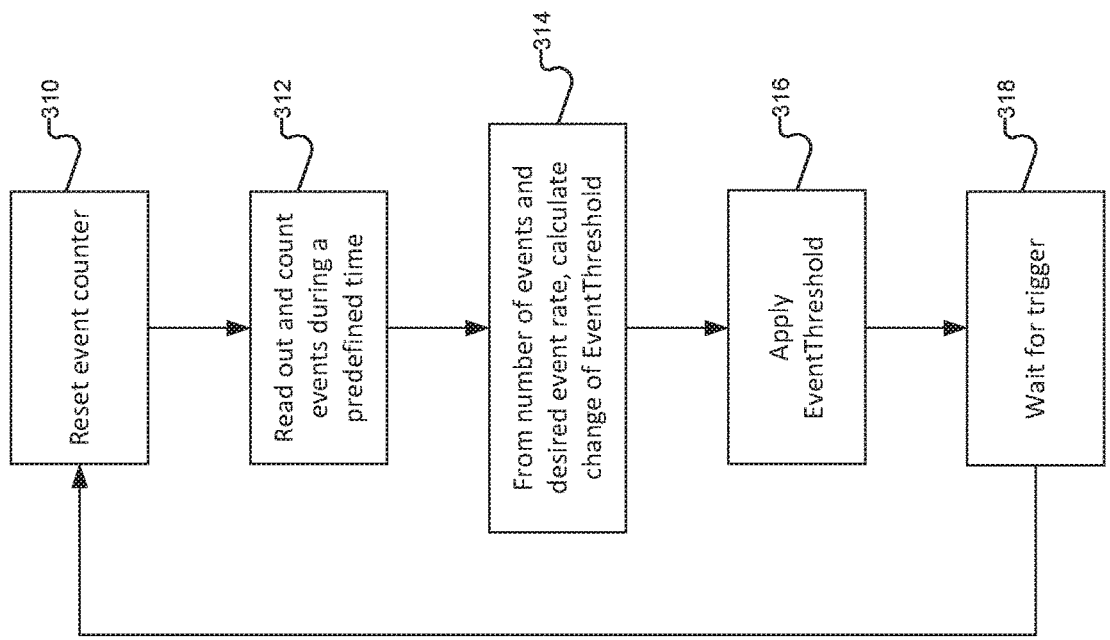
FIGS. 3A and 3B are flow diagrams illustrating the operation of the controller 120 for controlling the threshold generation circuit based on the event rate detector.
Figure 3A:
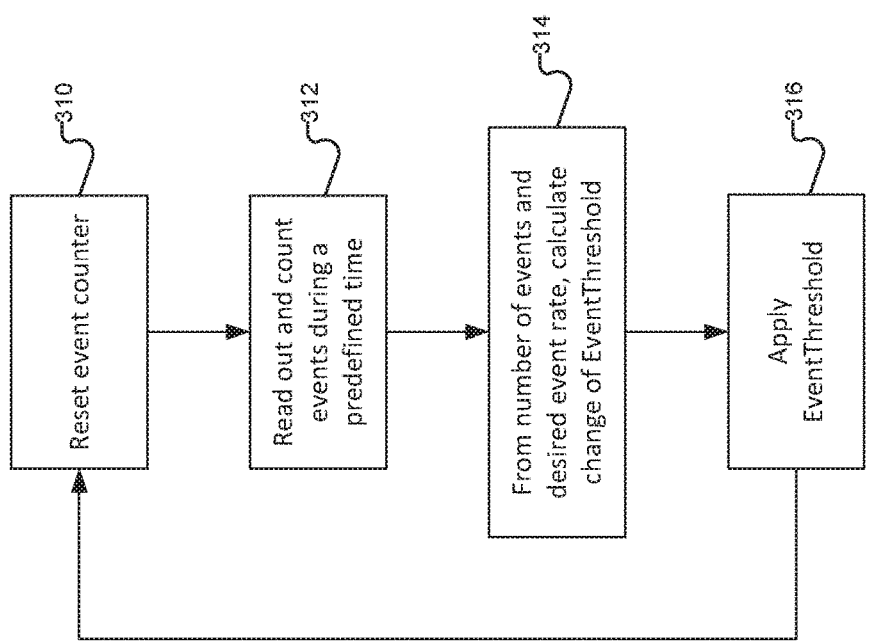

FIG. 3A is a flow diagram illustrating the operation of the controller 120 for controlling the threshold generation circuit 130 based on the event rate detector 200 according to one embodiment.

Specifically, in step 310, the counter 210 of the event rate detector 200 is reset by the controller 120 when a new count is required.

In step 312, the controller 120 reads out the count of the events after a predefined time.

Then, in step 314 the controller calculates a change in the event threshold that is to be applied to the pixel array 110. This new threshold is sent to the threshold generation circuit 130 in step 316. Then the threshold is applied to the event detectors 114 of the sensor array 110 as threshold Vb in determining the next set of events.

FIG. 3B is a flow diagram illustrating the operation of the controller 120 for controlling the event rate detector 200 according to another embodiment.

In this embodiment, the controller 120 waits for an external trigger in step 318 before resetting the counter in step 310. This embodiment would be most useful in the situation in which the sensor should be synchronized to an external timing source.

Event Count Estimator

A second approach relies on generating an event rate estimate. This approach employs an event count estimator within the event rate detector 200. It avoids having to read all the events from the array to determine the number of events. Instead, this approach allows roughly estimating the number of events, before the events are read out or as part of the read out process.

Figure 4:
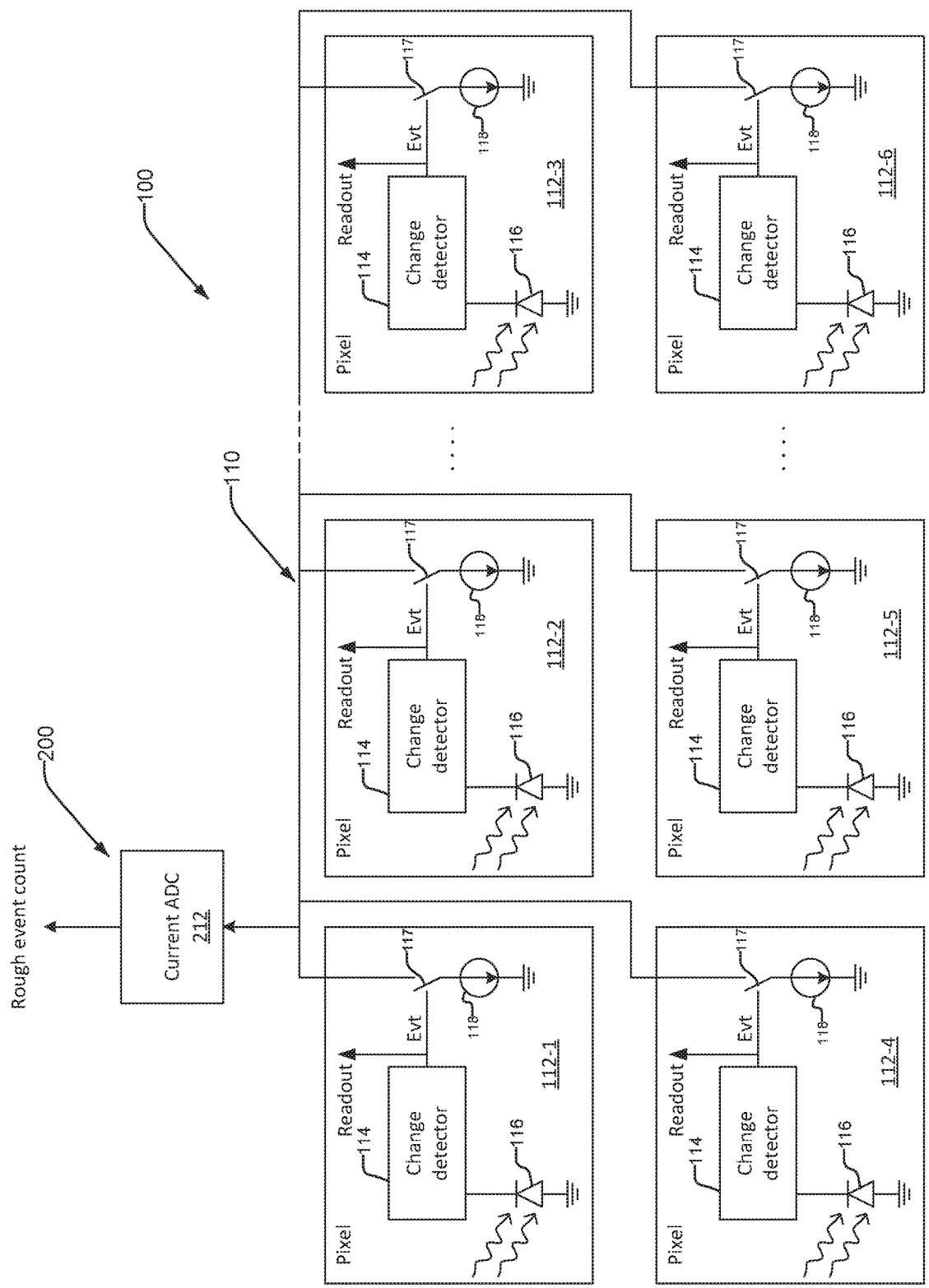
FIG. 4 is a schematic diagram showing an event based change detection sensor that generates an event rate estimate according to another embodiment.

FIG. 4 is a schematic diagram showing an event based change detection sensor 100 that generates an event rate estimate according to another embodiment.

In more detail, an event detector 114 is located in each pixel 112 of the array 110 and is part of each pixel circuit, along with a photoreceptor 116 for detecting incident light. A current source 118 of each pixel circuit 112 is enabled only if an event is present in this pixel.

Specifically, if the event detector 114 registers a change in the light received by the photosensor 116, such as due to an ON event and/or an OFF event, then the event signal Evt becomes active, which closes the switch 117 associated with that pixel 112.

The current of all pixels 112 of the array 110 or a sampling of pixels distributed through the extent of the array 110 of the sensor 100 is summed up and fed to a current analog to digital converter (ADC) 212 of the event rate detector 200. This ADC 212 takes the current and converts the magnitude of the current into a digital representation. This digital representation of the sum of the currents is then provided to the controller 120 as an estimate of the number of detected events, and if performed over a known period of time, it is indicative of the event rate.

In general, the current sources 118 will not be very well matched between pixels 112. This means that the sum of the currents will not allow an exact estimation of how many pixels have an event pending, but it will allow a rough estimate.

Figure 5:
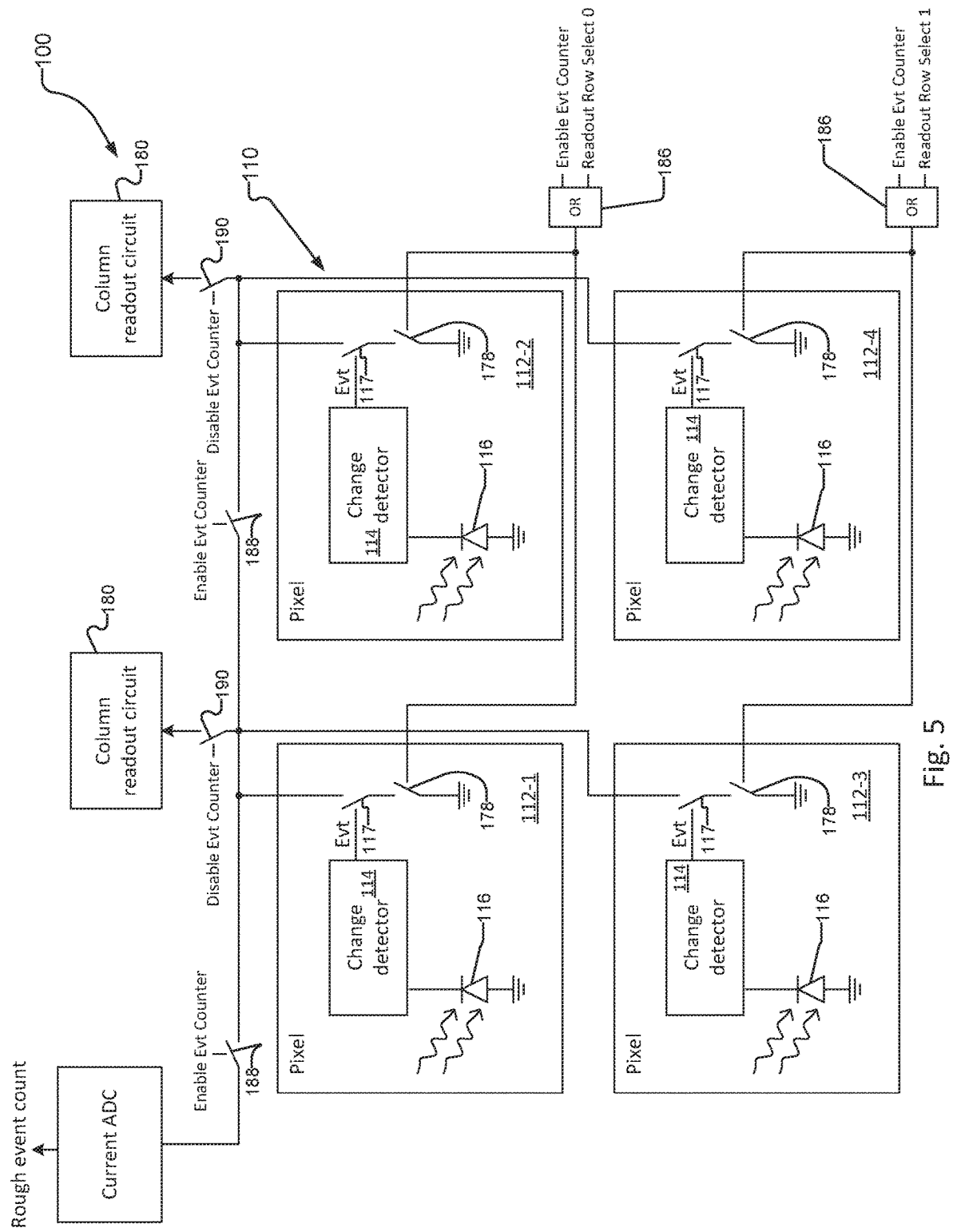
FIG. 5 is a schematic diagram showing an event based change detection sensor that generates an event rate estimate according to still another embodiment.

FIG. 5 is a schematic diagram showing a change detection sensor that generates an event rate estimate according to another embodiment.

In more detail, a photosensor 116 of each pixel 112 generates a signal that is responsive to and indicative of the instantaneous amount of light detected by that photoreceptor 116. This information is sent to the event detector 114.

Thus, the output of the comparator in the event detector 114 changes when the light received by the photoreceptor 116 has changed by an amount greater than the threshold with respect to the last time it was reset. Often, an ON event threshold is supplied to the pixel as the Pixel Threshold to discriminate ON events, which are associated with an increase in the amount of light detected by the photoreceptor 116. Then an OFF event threshold is supplied to the pixel as the Pixel Threshold to discriminate OFF events, which are associated with a decrease in the amount of light detected by the photoreceptor.

In other cases, the event detector includes two comparators, a first comparator that receives the ON event threshold to discriminate ON events, and a second comparator that receives the OFF event threshold to discriminate OFF events.

If the signal Enable evt counter is active (and thus Disable evt counter inactive), all the readout lines are shorted together by the closing of switches 188 and the readout lines are disconnected from the column readout circuits 180 by the opening of switches 190. With all the readout lines connected to the current ADC 212, a current will flow from the current ADC 212 to all pixels in which the comparator output is high and Evt is active to thereby close the switches 117 in each pixel 112. Further, the OR gates 186 for each row will close the switches 178 in each pixel 112 since Enable Evt counter is active. So the total current will depend on the number of pixels in which the output of the comparator 174 is high or signal line(s) Evt is/are active.

If the signal Enable evt counter is inactive (and thus Disable evt counter active), the pixel readout lines are connected to their corresponding column readout circuits 180 if the corresponding Readout row select X is active.

Figure 6:
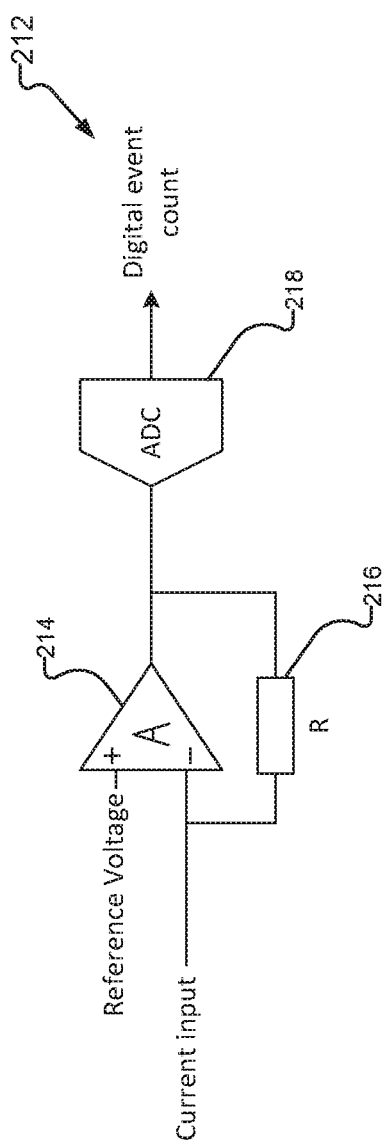
FIG. 6 is a circuit diagram showing a possible implementation of the current ADC 212 of the previous embodiments.

FIG. 6 shows a possible implementation of the current ADC 212 of the previous embodiments.

The summed current is fed to an operational amplifier A 214 with a resistor R 216 in a negative feedback configuration. The voltage difference between the reference voltage and the voltage at the output of the operational amplifier is proportional to the magnitude of the input current and represents thus the number of pending events.

The voltage at the output of the operational amplifier is then fed to a conventional voltage ADC 218, which can be implemented as a flash ADC, a SAR ADC, a sigma-delta ADC, etc.

After the current to voltage conversion, a voltage sampling step (between the out of the OpAmp 214 and the voltage ADC 218) can be added, so that the ADC conversion, which can be long, can be done while the pixels are read out. Once the ADC conversion is finished, the readout of the pixels can be stopped if needed.

Controller 120

The controller 120 is most likely a digital block that has as input the event rate detector 200 and a desired event rate (or bounds for the desired event rate) from outside the sensor 100, and optionally a trigger input. The controller 120 outputs control signals for the chip configuration (i.e., time resolution and threshold to the threshold generation circuit 130).

The controller 120 can be implemented as a traditional P, PI or PID controller, or more simply as a state machine.

However, when using an event rate estimator, the controller 120 could also be implemented as an analog circuit. The input to this analog controller then would not be a digital representation; instead the output voltage of the operation amplifier 214 in FIG. 6 would typically be directly fed to the controller 120.

Figure 7:
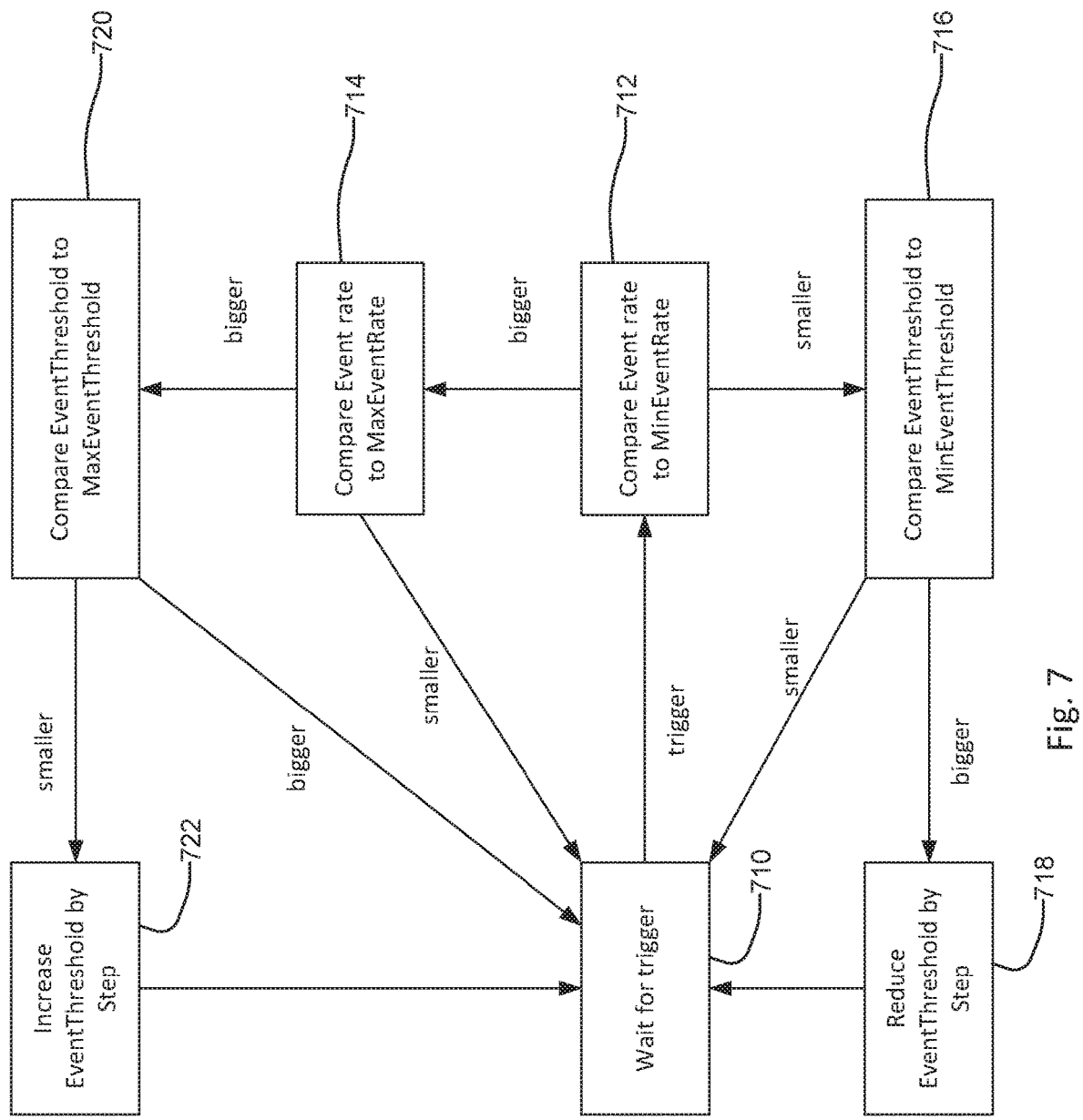
FIG. 7 is a state diagram showing a possible implementation of the controller 120.

FIG. 7 is a state diagram for the controller 120.

The event threshold is modified to hold the event rate within desired bounds based on the signaling from the event rate estimator.

Event rate: input from the event rate detector 200.
MinEventRate: constant, minimal desired event rate.
MaxEventRate: constant, max desired event rate.
MinEventThreshold: parameter, minimal threshold setting.
MaxEventThreshold: parameter, max threshold setting.
Step: parameter, step by which the event threshold is changed during each pass of the loop.
EventThreshold: output fed to event generation circuit.
Trigger: periodic input signal that starts the loop.

In more detail, the controller 120 waits for the trigger in state 710. When it is received, the controller 120 compares the event rate provided by the event rate detector 200 to a minimum event rate in state 712. If the event rate is smaller than the minimum event rate then the controller proceeds to state 716. In state 716, the controller 120 compares the event threshold to a minimum event threshold; if it is smaller, then it returns to the wait state in 710. On the other hand, if the event threshold is larger than the minimum event threshold then the event threshold is reduced in state 718 and it returns to the wait state 710.

On the other hand, if in state 712, the event rate is larger than the minimum event rate then the event rate is compared to the maximum event rate in state 714, if it is smaller, then the controller 120 returns to the wait state 710. On the other hand, if the event rate is larger than the maximum event rate then the event threshold is compared to the maximum event threshold in state 720. If the event threshold is larger than the maximum event threshold in state 720, then the controller 120 returns to the wait state 710. On the other hand, if the event threshold is smaller than the maximum event threshold then the event threshold is increased by a step in state 722 and returns to the wait state 710.

Threshold Generation Circuit

For change detection pixels such as those disclosed in U.S. Pat. Appl No. US 2008/00135731 by Lichtsteiner, et al., entitled "Photoarray for Detecting Time-Dependent Image Data", and incorporated herein by this reference, the event thresholds are the difference between a threshold voltage and an amplifier bias voltage. The On Threshold voltage is usually higher than the bias voltage, while the Off Threshold voltage is lower.

Basic Threshold Generation

Figure 8:
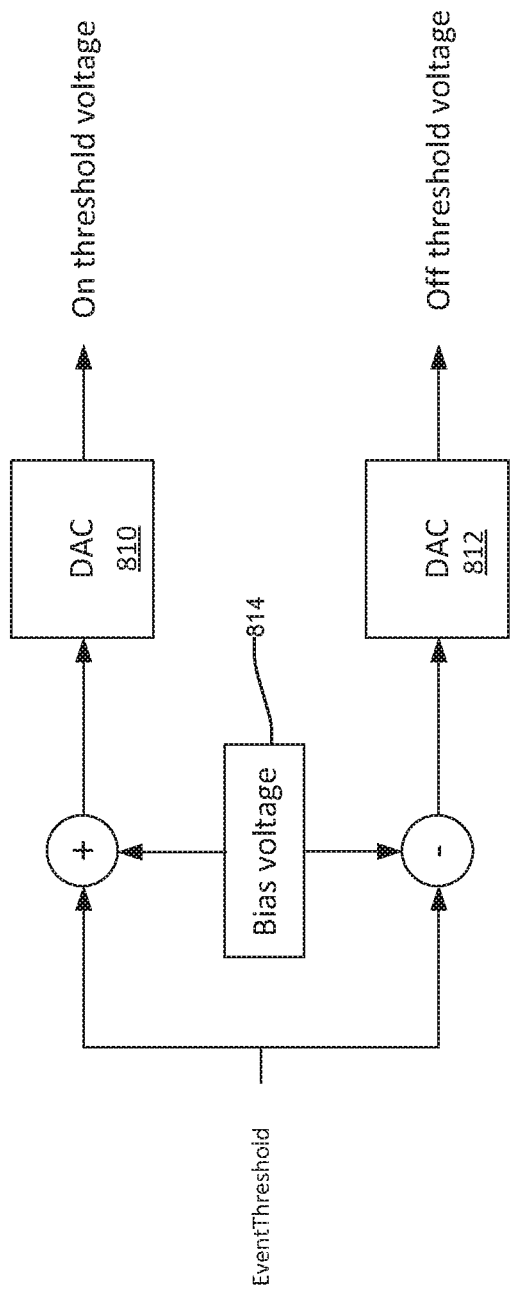
FIG. 8 is a block diagram showing a basic threshold generation circuit.

FIG. 8 shows a basic threshold generation circuit which is a set of voltage digital to analog converters (DACs) or current DACs 810, 812, such as those disclosed in P. Lichtsteiner, C. Posch, and T. Delbruck, "A 128×128 120 dB 15 μs Latency Asynchronous Temporal Contrast Vision Sensor," IEEE J. Solid-State Circuits, vol. 43, no. 2, pp. 566-576, February 2008; and T. Delbruck, R. Berner, P. Lichtsteiner, and C. Dualibe, "32-bit Configurable bias current generator with sub-off-current capability," in Proceedings of 2010 IEEE International Symposium on Circuits and Systems, 2010, pp. 1647-1650. Specifically, for the set of DAC's 810, 812, 814, there is one for generating the comparator bias voltage 814, one for the OnThres voltage 810 and one for the OffThres voltage 812.

Event Rate and Balance Control

In a further embodiment, the sensor 100 counts ON (increasing light intensity) and OFF (decreasing light intensity) events, separately. Then the ratio between ON and OFF events is used for controlling the ON and OFF thresholds separately. In general, it is desired a similar amount of ON events and OFF events over a large (larger than seconds) time window.

No-Motion Threshold

A property of event-based change detection sensors is that they do not generate data (or very little data) if there is no motion in the scene. In such a case of no motion, it may not be desirable to change the threshold, so the controller may be extended to include a minimal event rate threshold, below which the control loop to change the EventThreshold output is not activated.

Time Resolution Control

In some pixel designs, the time bin rate (rate of comparison) can be changed. In a pixel such as proposed by described in U.S. Pat. Appl No. US 2008/00135731, the refractory bias can be controlled, which allows limiting the rate at which a pixel can produce events.

While this invention has been particularly shown and described with references to preferred embodiments thereof, it will be understood by those skilled in the art that various changes in form and details may be made therein without departing from the scope of the invention encompassed by the appended claims.

What is claimed is:

1. A change detection sensor, comprising:
    a pixel array comprising pixels that detect light, wherein the pixels comprise photosensors and photoreceptor circuits that output first signals based on the response of the photosensors;
    event detectors for detecting events associated with light received by the pixels by comparing the first signals and a first reference voltage;
    an event rate detector for counting the events with a counter; and
    a controller for changing how the pixels detect the events based on the event rate detector by changing the first reference voltage;
    wherein the controller compares an event rate provided by the event rate detector to a maximum event rate, if the event rate is larger than the maximum event rate the controller changes a time resolution of the sensor.

2. The sensor as claimed in claim 1, further comprising a threshold generation circuit for setting thresholds applied by the event detectors by providing the first reference voltage.

3. The sensor as claimed in claim 1, wherein the controller changes the first reference voltage in response to the assessment provided by the event rate detector.

4. The sensor as claimed in claim 1, wherein the controller sets thresholds for ON events based on ON events in the pixel array based on the counter.

5. The sensor as claimed in claim 1, wherein each of the pixels comprises a memory capacitor of one of the event detectors for storing a charge corresponding to received light when the pixel was reset.

6. The sensor as claimed in claim 1, wherein each of the pixels comprises one or more comparators of one of the event detectors for comparing the changes in received light to the first reference voltage and a second reference voltage to detect the events.

7. The sensor as claimed in claim 1, further comprising comparators of the event detectors for comparing changes in received light to the first reference voltage to detect the events, the comparators being located in a readout circuit.

8. The sensor as claimed in claim 1, wherein the counter is incremented based on the events read out by a readout circuit.

9. The sensor as claimed in claim 1, wherein the counter is reset by the controller when a new count is required.

10. The sensor as claimed in claim 1, wherein the controller reduces the number of events during a sleep cycle and then increases the number of events during normal operating mode.

11. The sensor as claimed in claim 1, wherein the controller sets thresholds for ON events and OFF events based on ON events and OFF events in the pixel array based on the counter.

12. A method of operation of a change detection sensor, the method comprising:
    detecting light with pixels of a pixel array, wherein the pixels comprise circuits that output first signals based on the response of photosensors of the pixels;
    detecting events associated with light received by the pixels by comparing the first signals and a first reference voltage;
    counting the events with a counter with an event rate detector;
    changing how the pixels detect the events based on the event rate detector by changing the first reference voltage;
    comparing an event rate provided by the event rate detector to a maximum event rate; and
    if the event rate is larger than the maximum event rate, changing a time resolution of the sensor.

13. The method as claimed in claim 12, further comprising changing the first reference voltage in response to the assessment provided by the event rate detector.

14. The method as claimed in claim 12, further comprising setting thresholds for ON events based on ON events in the pixel array based.

15. The method as claimed in claim 12, wherein each of the pixels comprises a memory capacitor for storing a charge corresponding to received light when the pixel was reset.

16. The method as claimed in claim 12, wherein each of the pixels comprises one or more comparators for comparing the changes in received light to the first reference voltage and a second reference voltage to detect the events.

17. The method as claimed in claim 12, further comprising comparing changes in received light to the first reference voltage to detect the events using comparators located in a readout circuit.

* * * * *